United States Patent [19]

Alvarez et al.

[11] 4,339,513

[45] Jul. 13, 1982

[54] PROCESS AND RECORDING MEDIA FOR CONTINUOUS WAVE FOUR-LEVEL, TWO-PHOTON HOLOGRAPHY

[75] Inventors: David C. Alvarez, Gilroy; Gary C. Bjorklund, Los Altos; Donald M. Burland, Los Gatos, all of Calif.

[73] Assignee: International Business Machines Corporation, Armonk, N.Y.

[21] Appl. No.: 208,740

[22] Filed: Nov. 20, 1980

Related U.S. Application Data

[63] Continuation-in-part of Ser. No. 170,497, Jul. 21, 1980, abandoned.

[51] Int. Cl.$^3$ .......................... G03C 5/04; G03C 1/76
[52] U.S. Cl. .......................................... 430/1; 430/2; 430/80; 430/270; 430/281; 430/394; 430/495; 430/945; 350/3.6; 350/3.61; 544/179
[58] Field of Search ................... 430/1, 2, 75, 76, 79, 430/80, 81, 82, 495, 83, 270, 281, 296, 541, 600, 613, 614, 945, 394; 350/3.6, 3.61; 544/179

[56] References Cited

U.S. PATENT DOCUMENTS

3,775,110 11/1973 Bestenreiner et al. ................. 430/1
4,173,474 11/1979 Tanaka et al. ......................... 430/2
4,201,441  5/1980 Matsumoto et al. ................... 430/2
4,239,850 12/1980 Kita et al. ........................... 430/281

OTHER PUBLICATIONS

Scientific American, Jun. 1961, vol. 204, No. 6, pp. 52–61.
Journal of Amer. Chem. Soc., vol. 98: No. 18, 9-1-1976, pp. 5443–5450.
Journal of Amer. Chem. Soc., vol. 100: No. 10, 5-10-1978, pp. 3242–3243.
Chem. Absts. 88: 180183k.
IBM J. Res. Dev., vol. 23, No. 5, Sep. 1979, pp. 534–546.

*Primary Examiner*—Mary F. Downey
*Attorney, Agent, or Firm*—Joseph G. Walsh

[57] ABSTRACT

A process and recording medium for four-level, two-photon holography are provided. These media are particularly useful for recording holograms using continuous wave lasers. The recording medium is formed by a transport resin containing a tetrazine compound.

10 Claims, 4 Drawing Figures

PROCESS AND RECORDING MEDIA FOR CONTINUOUS WAVE FOUR-LEVEL, TWO-PHOTON HOLOGRAPHY

This application is a continuation-in-part of copending application Ser. No. 06/170,497 which was filed on July 21, 1980, now abandoned.

DESCRIPTION

1. Technical Field

The present invention is concerned with a process and recording media for holography. In particular, it is concerned with four-level materials useful for two-photon holography. These materials are particularly useful for holographic recording using continuous wave lasers. A specific example of such a recording medium is formed by a transparent resin containing a tetrazine compound therein.

2. Prior Art

The state of the prior art is illustrated by the following references:

1. "Multiphoton Photorefractive Processes for Optical Storage in $LiNbO_3$," D. von der Linde, A. M. Glass and K. F. Rodgers, Appl. Phys. Lett. 25, p. 155 (1974).
2. "High-sensitivity Optical Recording in KTN by Two-photon Absorption," D. von der Linde, A. M. Glass and K. F. Rodgers, Appl. Phys. Lett. 26, p. 22 (1975).
3. "Optical Storage Using Refractive Index Changes Induced by Two-step Excitation," D. von der Linde, A. M. Glass and K. F. Rodgers, Jour. of Appl. Phys. 47, p. 217 (1976).
4. "Formation of Integrated Optics Components by Multiphoton Photorefractive Processes," C. M. Verger, N. F. Hartman and A. M. Glass, 30, p. 272 (1977).
5. U.S. Pat. No. 3,922,061, "Optical Storage Apparatus and Process," A. M. Glass and D. von der Linde, Bell Telephone Laboratories.

The two-photon recording media used in this prior work were exclusively single crystal pyroelectric materials. These materials have the disadvantage that, unless subjected to a thermal fixing process after exposure, the holograms decay on a time scale of months. Furthermore, the efficiencies of the hologram formation by two-photon processes in these materials are relatively low. In all of this prior work it was necessary to employ high power pulsed lasers to produce the holograms and it was thus impossible to record holograms with convenient cw lasers such as GaAs and HeNe lasers. Finally, the single crystal nature of these materials makes the production of arbitrarily sized samples difficult. No prior art of which we are aware suggests the use of two-photon four-level systems for recording holograms. Nor are we aware of any prior art suggesting the use of a tetrazine compound to produce holograms.

BRIEF DESCRIPTION OF THE DRAWINGS

Understanding of the operation of the present invention may be had by reference to the figures.

DISCLOSURE OF THE INVENTION

According to the present invention, a recording process for holography is described in systems that exhibit photochemical or photophysical changes as a result of four-level two-photon processes. A specific embodiment of such a four-level, two-photon system is provided by a transparent resin containing a tetrazine compound. Four-level, two-photon systems have three novel features which are not present in any other currently available recording medium for two-photon holography. First, unlike previously described three energy level two-photon systems, these systems have four energy levels involved in the photochemical process. As will be described below, this permits significant intermediate state populations to be produced with modest irradiating powers and makes possible two-photon holography at milliwatt cw power levels. Second is the insensitivity of the two-photon material to erasure by the reading beam, making possible archival information storage. Third is the possibility as will be described, of gating the holographic recording process on or off with an additional light beam.

Figure 1:
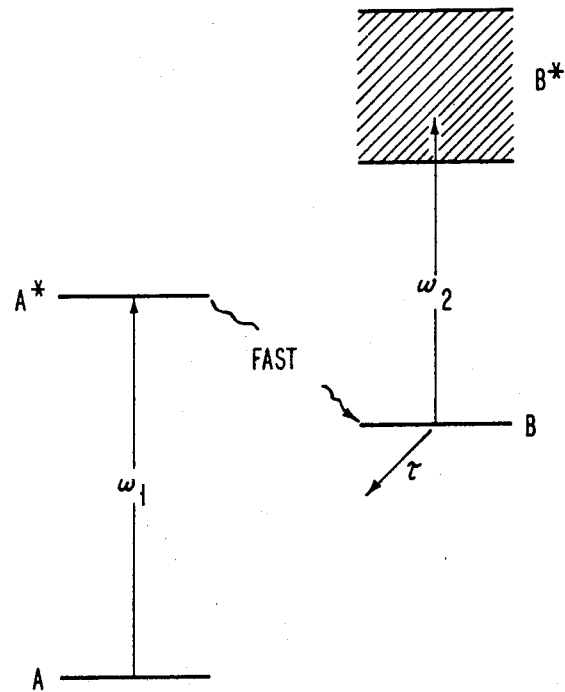
FIG. 1 is a schematic representation of a general four-level two-photon process.

The recording media of the present invention are formed from systems exhibiting four-level, two-photon photon processes. The energy levels of such a system are shown in FIG. 1. A hologram is recorded as a result of photochemical or photophysical changes in the recording medium that occur after two-photons excitation to the state B*. These changes result in corresponding changes in the index of refraction and/or the absorption coefficient. The state B* is excited by a two step process in the following way. In the first step, the system in its ground state A absorbs a photon at a frequency $\omega_1$ and is converted to the state A*. This state undergoes cascade relaxation producing a metastable state B. In the second step, the state B can relax back to the ground state A with a lifetime $\tau$ or it may absorb a photon at the frequency $\omega_2$. Absorption of this second photon produces the state B* from which the photophysical or photochemical processes occur.

Figure 2:
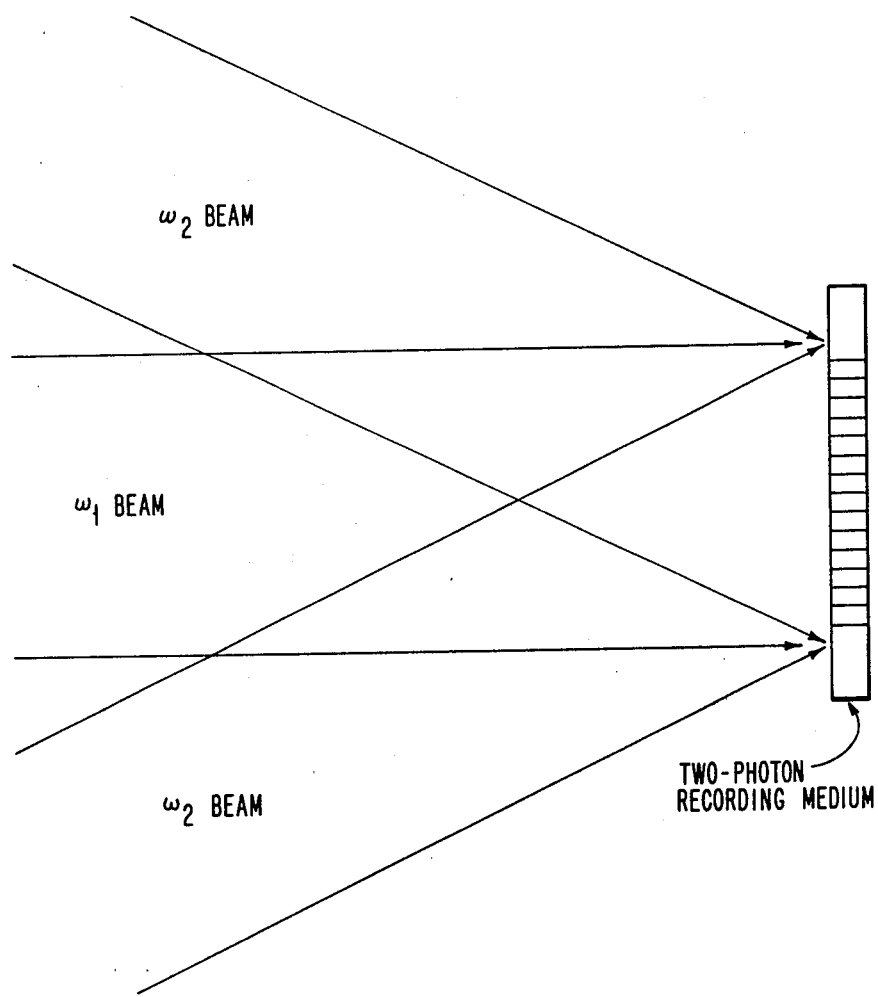
FIG. 2 illustrates the situation where the hologram is produced by two interfering laser beams at the frequency $\omega_2$ and the recording medium is uniformly illuminated by a third beam at a frequency of $\omega_1$.

Two methods of recording the hologram can be envisioned. In the simplest configuration, two interfering laser beams are used to produce the fringes. The laser frequency is chosen so that both the first and second steps are pumped efficiently. In this case $\omega_1 = \omega_2$. The rate of the writing process in this case is proportional to the square of the laser intensity since two laser photons must be absorbed for photochemistry to occur. In the second method three beams are used. The hologram is produced by the interference of two of these beams. These two beams, which must be coherent, may be chosen to maximize the rate of either the first or second step. Consider the case where the hologram is produced in the second step. A third beam which need not be coherent also illuminates the sample. This beam would be optimally chosen to maximize the first step. FIG. 2 shows the case just discussed, where the hologram fringes are produced at $\omega_2$ and the recording medium is uniformly illuminated by a beam of $\omega_1$ radiation. From the standpoint of the $\omega_2$ radiation, the recording medium is "sensitized" or "turned on" or "gated" by the presence of the $\omega_1$ radiation.

The two-photon nature of the photochemistry provides additional degrees of freedom for holographic applications and makes it possible to produce holograms which are relatively insensitive to the readout beam, time gated, or spatially modulated. Assuming that $\omega_1 \neq \omega_2$ and that $\omega_1$ and $\omega_2$ are chosen so that $\omega_1$ efficiently pumps only the first step and $\omega_2$ only the last step in the photochemical process, then holograms can be efficiently recorded only when radiation at both frequencies is simultaneously present. Thus, a hologram resulting from the interference of two $\omega_2$ beams will be efficiently recorded only when the recording medium is exposed to a $\omega_1$ beam. Once the hologram is recorded and the $\omega_1$ beam turned off, the hologram will be relatively insensitive to further deleterious exposure caused by low power readout beams at $\omega_2$. Even if $\omega_1 = \omega_2 = \omega$ and $\omega$ is chosen to pump both steps in the photochemical process, the holograms can be made essentially insensitive to further exposure during readout by taking advantage of the intensity squared dependence of the photochemistry and using reduced intensity readout beams. Time gating can be accomplished by chopping the $\omega_1$ beam and spatial modulation by utilizing a nonuniform $\omega_1$ beam.

It is possible utilizing the scheme outlined in FIG. 1, to define a set of criteria for selecting two-photon, four-level systems for holographic applications using cw lasers. The following criteria must be satisfied:

(1) The intermediate level A* must be effectively excited by the light at $\omega_1$. Thus molecules in state A must have large cross-sections for absorptions of $\omega_1$ radiation ($\sigma > 10^{-18}$ cm$^2$).

(2) A fast (10 nsec or less) decay mechanism with high quantum yield must exist between levels A* and B. When $\omega_1$ radiation pumps the A→A* transition, substantial cascade excitation of level B must occur.

(3) Level B must be metastable with respect to decay back to the ground state A and have a lifetime $\tau$ of at least 10 $\mu$sec. The slow decay of the excitation of this level thus acts as a bottleneck and a substantial fraction of the total molecular population may be temporarily stored in this level.

(4) The final state B* must be effectively excited by the light at $\omega_2$. Thus molecules in state B must have large cross-sections for absorption of $\omega_2$ radiation ($\sigma > 210^{-18}$ cm$^2$).

(5) Levels A, A* and B must be relatively inert within the medium.

(6) Level B* must produce the photophysical or photochemical changes that result in hologram recording with a reasonable quantum efficiency.

For specific applications one can, of course, make more specific requirements. For example, in applications where gating is necessary, it is desirable to have $\omega_1 \neq \omega_2$. For semiconductor laser applications, it is desirable to have $\omega_2$ be in the near infrared.

Recording media of the present invention that satisfy these requirements for four-level two-photon photochemistry are exemplified by transparent resins containing a tetrazine compound. Polyvinyl carbazole has been found to be convenient as the transparent resin, but other transparent resins known to the art also give good results. In this category, mention may be made of polystyrene, phenolic resins of the Novolac type, and acrylic resins such as polymethyl methacrylate. Contained in the transparent resin is a compound containing the tetrazine ring structure. Particularly useful are 3,6-dialkyl substituted tetrazines such as 3,6-dimethyl-1,2,4,5-tetrazine and 3,6-dibutyl-1,2,4,5-tetrazine. The concentration of the tetrazine compound in the transparent resin is within the range of from about 0.1 to about $10^{-5}$ grams/cc, preferably within the range 0.05 gram/cc to 0.1 gram/cc. The tetrazines should be uniformly distributed throughout the resin. The fringes of the hologram are recorded by spatial modulation of the tetrazine concentration after exposure to two or three laser beams of frequency $\omega_1$ and $\omega_2$. Note that $\omega_1$ may equal $\omega_2$.

The tetrazine-transparent resin recording system has two novel features. First is the sensitivity of the intermediate to red radiation. This allows the hologram to be written at frequencies near that of the HeNe cw laser. The hologram can thus be read using a HeNe laser with a minimum of distortion due to differences in read and write frequencies. The second novel feature is the organic nature of the material and its compatibility with room temperature polymeric hosts. This allows the recording medium to be cheaply and easily fabricated to arbitrary dimensions.

Figure 3:
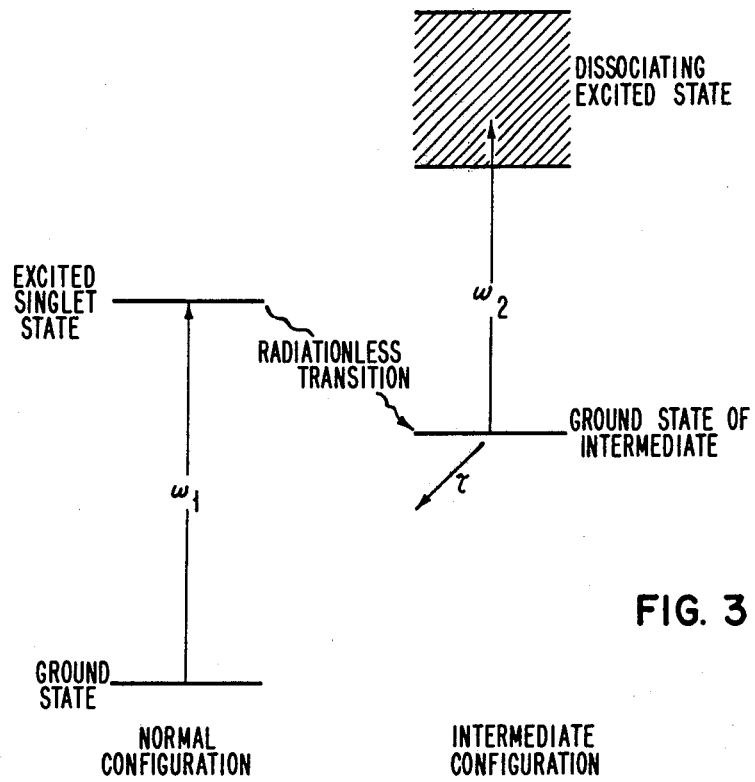
FIG. 3 is a schematic representation of the 4-level, 2-photon photochemical process involved in the photodissociation of the tetrazines.

The photodissociation of the tetrazine occurs as a result of a four-level two-photon photochemical process which is described in FIG. 3. The ground state tetrazine molecule absorbs a $\omega_1$ photon and is promoted to an excited singlet state of the normal configuration, i.e., the configuration shown in FIG. 1. This excited state undergoes a radiationless decay to a new intermediate molecular configuration. The lifetime $\tau$ of this intermediate configuration is approximately 1 msec and thus this level acts as a bottleneck which gathers a considerable population even when pumping with modest cw power levels at frequency $\omega_1$. The permanent photochemistry occurs when the ground state intermediate absorbs a $\omega_2$ photon. The tetrazine is converted to $N_2$ and, in the case of the dimethyl derivative, $CH_3CN$. This photochemistry results in permanent changes in the system's absorption coefficient and index of refraction. Holograms can thus be produced by producing an interference pattern at the sample using either $\omega_1$ or $\omega_2$ frequencies.

Figure 4:
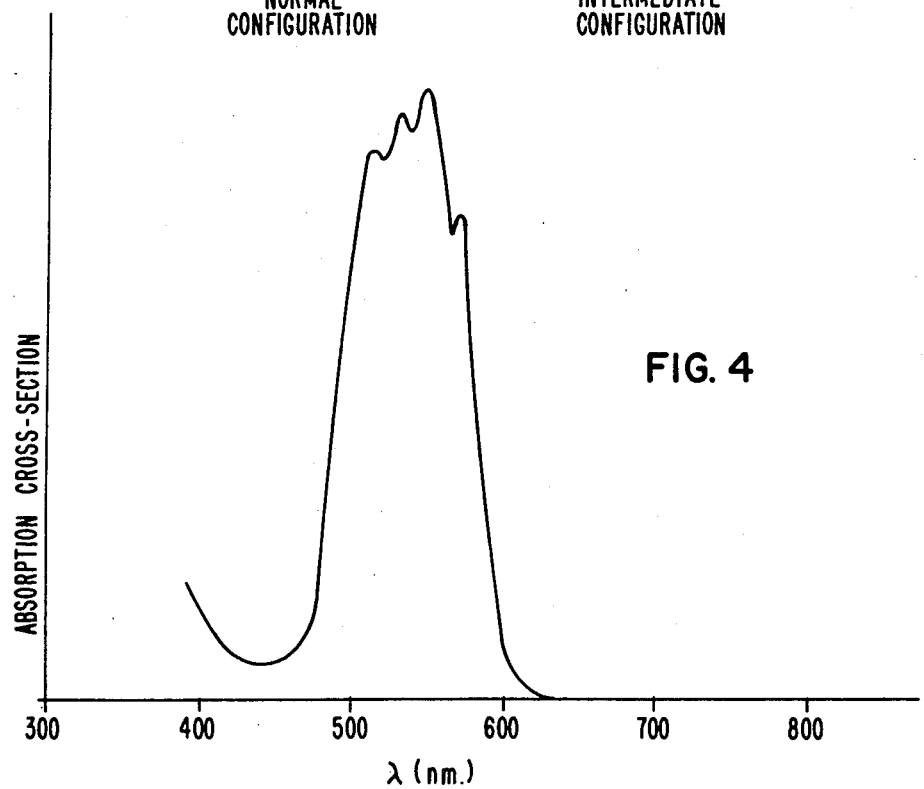
FIG. 4 shows the tetrazine absorption bands which correspond to the first step of the photochemical process.

The absorption band which corresponds to the first step in this process is shown in FIG. 4. It is evident that the first step, which is the normal configuration transition, is most efficiently pumped by light with wavelengths between 500 and 580 nm, but can be pumped by light at a wavelength as long as 600 nm. The absorption corresponding to the second transition, that is the intermediate configuration transition, is known to be similar to that of the first step.

By comparing FIGS. 1 and 3, one can see that tetrazine photochemistry provides an example of a four-level, two-photon photochemical system. Holograms have been recorded in tetrazine containing media using cw lasers and milliwatts of power. The sensitivity to cw red radiation allows holographic optical elements to be produced which are matched to specific cw laser sources such as HeNe lasers. For instance, a focusing element could be formed by using the two-photon process to record the fringes formed by the interference of the raw output beam of a cw laser near the HeNe laser beginning at 632.8 nm with a converging beam at the same frequency. Since long coherence lengths can only be achieved with cw lasers, the cw recording capability should make it possible to record big holograms or to achieve large depths of field in the hologram image. It is, of course, also possible to record holograms in this system using higher power pulsed lasers as well.

The organic nature of the material, its compatability with room temperature polymeric hosts, and the permanent nature of the two-photon photochemistry make is useful for large volume archival information storage. Large quantities of the recording medium can be cheaply and easily fabricated as tapes, disks, drums etc.

The recording materials discussed in the present invention are clearly superior to earlier two-photon materials. The permanent nature of the photochemistry makes possible the production of permanent holograms without a fixing step and the polymeric host in the tetrazine case makes sample fabrication flexible and economical. However, the major advantage is the highly efficient two-photon photochemistry which makes possible two-photon holography at cw power levels. This enhanced efficiency is due to the novel arrangement of energy levels in the material. In particular for tetrazine, the presence of a msec lifetime intermediate configuration which is populated by decay from a normal configuration excited state greatly enhances the two-photon process by removing the normal tradeoff between intermediate state lifetime and the absorption cross section for the first photon.

In summary, the present invention for the first time provides a two-photon, four-level holographic recording process. The process comprises the steps of:
(1) shining a single beam of light of frequency $\omega_1$ upon a four-level holographic recording medium, and
(2) exposing the recording medium to light at frequency $\omega_2$, thereby forming a holographic interference pattern in the recording medium and changing the index of refraction and/or the absorption coefficient of said recording medium.

Holograms can also be formed using only two interferring laser beams for the case where $\omega_1 = \omega_2$.

We claim:
1. A recording medium for holography, said medium comprising a transparent resin containing from $10^{-5}$ to 0.1 gram/cc of a tetrazine compound.
2. A medium as claimed in claim 1 wherein the tetrazine compound is a 3,6-dialkyl-1,2,4,5-tetrazine.
3. A medium as claimed in claim 1 wherein the tetrazine compound is 3,6-dimethyl-1,2,4,5-tetrazine.
4. A medium as claimed in claim 1 wherein the tetrazine compound is present at a concentration of from about 0.05 gram/cc to about 0.1 gram/cc.
5. A medium as claimed in claim 1 wherein the transparent resin is polyvinylcarbazole.
6. A recording medium for continuous wave two-photon holography comprising polyvinylcarbazole resin containing 3,6-dimethyl-1,2,4,5-tetrazine at a concentration of about 0.05 to 0.1 gram per cc.
7. A process for two-photon, four-level holographic recording, said process comprising the steps of:
(1) shining a single beam of light of frequency $\omega_1$ upon a four-level holographic recording medium, and
(2) exposing the recording medium to laser light at frequency $\omega_2$, thereby forming a holographic interference pattern in the recording medium and changing the index of refraction and/or the absorption coefficient of said recording medium.
8. A process as claimed in claim 7 wherein $\omega_1$ equals $\omega_2$.
9. A process as claimed in claim 7 wherein $\omega_1$ does not equal $\omega_2$.
10. A process as claimed in claim 7 wherein the light is from a continuous wave laser.

* * * * *